United States Patent
Hurwitz et al.

(10) Patent No.: US 9,615,447 B2
(45) Date of Patent: Apr. 4, 2017

(54) MULTILAYER ELECTRONIC SUPPORT STRUCTURE WITH INTEGRAL CONSTRUCTIONAL ELEMENTS

(75) Inventors: Dror Hurwitz, Zhuhai (CN); Alex Huang, Qianwu Town (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 0 days.

(21) Appl. No.: 13/555,437

(22) Filed: Jul. 23, 2012

(65) Prior Publication Data

US 2014/0020945 A1 Jan. 23, 2014

(51) Int. Cl.
*H05K 1/02* (2006.01)
*H01L 23/498* (2006.01)
*H01L 23/00* (2006.01)
*H05K 1/11* (2006.01)

(52) U.S. Cl.
CPC ..... *H05K 1/0271* (2013.01); *H01L 23/49827* (2013.01); *H01L 23/49838* (2013.01); *H01L 23/562* (2013.01); *H01L 2924/0002* (2013.01); *H05K 1/11* (2013.01); *H05K 2201/09781* (2013.01)

(58) Field of Classification Search
CPC .......... H01L 23/498; H01L 21/48; H01L 2924/15311; H01L 23/49833; H01L 21/4857; H01L 2924/1517; H01L 23/49822; H05K 3/46; H05K 2201/10674; H05K 2201/09781; H05K 3/4076; H05K 1/0271; H05K 2201/2009; H05K 1/0281

See application file for complete search history.

(56) References Cited

U.S. PATENT DOCUMENTS

| | | | | |
|---|---|---|---|---|
| 5,304,743 | A * | 4/1994 | Sen et al. | 174/262 |
| 6,506,979 | B1 * | 1/2003 | Shelnut et al. | 174/255 |
| 6,713,685 | B1 * | 3/2004 | Cotton | 174/262 |
| 6,946,692 | B1 * | 9/2005 | Hsu | 257/211 |
| 7,635,641 | B2 | 12/2009 | Hurwitz et al. | |
| 7,669,320 | B2 * | 3/2010 | Hurwitz et al. | 29/846 |
| 7,682,972 | B2 | 3/2010 | Hurwitz et al. | |
| 8,138,424 | B2 * | 3/2012 | Shimizu | 174/255 |
| 8,153,902 | B2 * | 4/2012 | Nakamura et al. | 174/254 |
| 8,334,461 | B2 * | 12/2012 | Taguchi et al. | 174/252 |
| 8,530,751 | B2 * | 9/2013 | Maeda et al. | 174/258 |
| 2007/0079986 | A1 * | 4/2007 | Kikuchi et al. | 174/260 |

* cited by examiner

*Primary Examiner* — Ishwarbhai B Patel
(74) *Attorney, Agent, or Firm* — Wiggin and Dana LLP; Gregory S. Rosenblatt; Jonathan D. Hall (57) ABSTRACT

A multilayer electronic support structure including at least one pair of adjacent feature layers extending in an X-Y plane that are separated by a via layer; said via layer comprising a dielectric material that is sandwiched between the two adjacent feature layers and at least one constructional element through the dielectric material spanning between said pair of adjacent feature layers in a Z direction perpendicular to the X-Y plane; wherein said at least one constructional element is characterized by having a long dimension in the X-Y plane that is at least 3 times as long as a short dimension in the X-Y plane and wherein the at least one constructional element is fully encapsulated within the dielectric material and is electrically isolated from its surrounding.

20 Claims, 6 Drawing Sheets

MULTILAYER ELECTRONIC SUPPORT STRUCTURE WITH INTEGRAL CONSTRUCTIONAL ELEMENTS

BACKGROUND

Field of the Disclosure

The present invention relates to multilayer electronic support structures which are generally thin yet rigid and stiff, and to methods of fabrication thereof.

Description of the Related Art

Advanced IC substrates in the formats of Flip Chip Ball Grid Arrays (FCBGA) and Flip Chip Scale Packages (FCCSP) usually employ a 'core' structure that is typically a Glass/Polymer dielectric composite that has a small number, typically 2 or more copper layers on one or both sides. The copper layers are electrically interconnected using Plated through holes (PTHs).

The Glass/Polymer dielectric composite core serves as a base on which are built up a multilayer stack consisting of layers of dielectric, typically polymer film or prepreg, that sequentially alternate with layers of copper metal that are interconnected by filled copper micro vias.

The finished FCBGA or FCCSP substrates units are required to demonstrate a high degree of flatness and are required to be warp free in order to support subsequent process steps, such as the attaching of active (IC) and passive components in what is sometimes known as "first level assembly".

To balance stresses during fabrication, subsequent processing and whilst in service, which could otherwise result in warpage or delamination, the multilayer stack is preferably built up on both sides of the base. After the first level assembly, the total unit, including the IC(s), passive components and the substrate that carries them, is sometimes known as an 'IC Package'.

The IC Package requires attachment to the next level of the electronic subsystem, which usually includes a Printed Circuit Board (PCB). The series of processes that are used to attach the IC Package to the PCB are sometimes referred to as 'second level assembly'.

Many modern electronic systems, particularly handheld devices such as smart phones, tablets, and the like require additional functionality, enhanced electrical performance, lower heat dissipation and ever slimmer IC packages. Consequently, the first and second level assembly processes become ever more complex since the IC substrate may carry on it 3D package architecture, such as a series of stacked dies or even another IC package using what is sometimes referred to as 'PoP', an acronym for Package on Package.

It will therefore be appreciated that advanced IC substrates in FCBGA or FCCSP formats are required to have superior flatness, not only during their own fabrication, but also in subsequent processing, since they are typically exposed to various elevated temperatures and harsh processing conditions during both first and second level assembly processing.

In consequence of the above, warping of the IC substrate may severely reduce yields during first and second level assembly, especially when Die Stacking and 3D PoP architectures are employed. Warped FCBGA and FCCSP substrates or IC packages may cause cracks in the Flip Chip bumps interconnecting the IC to the substrate, cracks in the BGA balls that interconnect the IC package to the PCB (or to another IC package in PoP configuration) or even die cracking, all of which may lead to system failures.

The demand for ever thinner IC substrates is increasing, driven by the need to meet low form factor space requirements for modern handheld devices and to achieve lower inductance and lower thermal impedance with yet higher contact points for more device functionality. Consequently, the microelectronics industry has been considering employing what has been referred to as 'Coreless' IC substrates having FCBGA or FCCSP formats that are constructed out of a build up of layers, but without the central 'core' section. Coreless substrates of this type have significantly reduced thickness, improved system inductance due to the short via paths to and from the IC, and improved thermal impedance. However, coreless substrates may be susceptible to warping due to their inherent lack of mechanical stiffness and the lack of support that would normally be provided by the absent core section. These problems may become acute during exposure to elevated processing temperatures when fabricating the first and second level assemblies thereupon, and particularly in consequence of the thermal processes that are employed to stack dies and/or packages.

Various coreless substrate technologies that feature build up structures with dielectric films have been proposed in recent years. Most coreless substrate technologies require an external metal frame stiffener mounted on the IC side of the substrate in order to maintain an acceptable level of flatness and to compensate for the lack of a core in the structure. It will, however, be appreciated that such external stiffeners occupy premium real estate space on the top surface of the substrate, and this occupied space is unavailable for other purposes, such as for mounting passive components mounting and/or pads that may be required to couple an additional IC package stacked on the substrate surface.

One approach that addresses this problem is the use of coreless IC substrates as developed by AMITEC and as described in U.S. Pat. Nos. 7,682,972, 7,669,320 and 7,635,641 to Hurwitz et al. Amitec's technology allows the fabrication of a coreless substrate that may employ glass fabric/polymer composites materials (prepregs) that enhance the over all substrate flatness and resistance to warping and therefore eliminates the need for an external metal frame stiffener as described above.

Nevertheless, the ever increasing demands to meet tighter requirements, such as thinner substrates having lower thermal impedances, pose further challenges, that even the AMITEC coreless structures as described in U.S. Pat. Nos. 7,682,972, 7,669,320 and 7,635,641 may find hard to overcome.

SUMMARY OF THE INVENTION

A first aspect of the invention is directed to providing a multilayer electronic support structure comprising at least one pair of adjacent feature layers extending in an X-Y plane that are separated by a via layer; said via layer comprising a dielectric material that is sandwiched between the two adjacent feature layers and at least one constructional element through the dielectric material spanning between said pair of adjacent feature layers in a Z direction perpendicular to the X-Y plane; wherein said at least one constructional element is characterized by having a long dimension in the X-Y plane that is at least 3 times as long as a short dimension in the X-Y plane and wherein the at least one constructional element is fully encapsulated within the dielectric material and is electrically isolated from its surrounding.

In some embodiments, the at least one constructional element is electrically non functional.

In some embodiments, the multilayer electronic support structure comprises a central electronically functional area of conductive vias and features and a surrounding area, wherein the constructional element is situated in the surrounding area.

In some embodiments, the central electronically functional area of conductive vias and features is for coupling a chip by a Flip Chip technology.

In some embodiments, the technology is selected from the group comprising Flip Chip BGA (FCBGA), Flip Chip Chip Scale Package (FCCSP), Flip Chip Pin Grid Array (FCPGA) and Flip Chip Land Grid Array (FCLGA).

In some embodiments, the multilayer electronic support structure has planar dimensions of at least 25 mm×25 mm and no more than 60 mm×60 mm.

In some embodiments, the central electronically functional area has dimensions of at least 10 mm×10 and no more than 25 mm×25 mm.

In some embodiments, the at least one constructional element is for relieving residual stresses and aiding planarity.

In some embodiments, the at least one constructional element is positioned along an edge of the support structure.

In some embodiments, the at least one constructional element is positioned in the surrounding area along all sides of the central electronically functional area.

In some embodiments, the multilayer electronic support structure serves for supporting a chip, comprising a plurality of constructional elements arranged radially around the chip.

In some embodiments, the at least one constructional element comprises a corner angle for positioning in a corner of the support structure.

In some embodiments, the at least one constructional element lies within a single layer.

In some embodiments, the at least one constructional element spans a plurality of layers.

In some embodiments, the at least one constructional element has a profile that is selected from the group consisting of square shaped, rectangular shaped, T shaped, inverted T shaped, I shaped, J shaped and L shaped profiles.

In some embodiments, the at least one constructional element comprises a pad in a feature layer and a non-cylindrical via on said pad.

In some embodiments, the pad comprises an adhesive layer comprising a metal selected from the group comprising titanium, tantalum, tungsten and chromium.

In some embodiments, the constructional element is corrugated or crenulated along its length.

In some embodiments, the dielectric material comprises a polymer.

In some embodiments, the polymer comprises polyimide, epoxy, Bismaleimide, Triazine and blends thereof.

In some embodiments, the dielectric material further comprises inorganic inclusions.

In some embodiments, the inorganic inclusions comprise glass fibers.

In some embodiments, the inorganic inclusions comprise ceramic particles.

A second aspect of the invention is directed to a process for stiffening a multilayer electronic support structure comprising incorporating at least one constructional element within the multilayer electronic support structure.

In some embodiments, the at least constructional element comprises a non-electronically functional elongated metallic inclusion.

In some embodiments, the method comprises the steps of: depositing a seed layer onto an underlying dielectric layer, and pattern or panel plating a first layer of the at least one constructional element onto the seed layer.

In some embodiments, the method further comprises building up additional layers onto the first layer of at least one non-electronically functional elongated metallic inclusion onto the seed layer.

In some embodiments, the method further comprises the steps of:
(a) obtaining a substrate including an underlying via post layer that is treated to expose ends of via posts in the via post layer;
(b) covering the substrate with a seed layer;
(c) applying a first layer of photoresist over the seed layer;
(d) exposing and developing the photoresist to form a pattern of features including a first part of the at least one constructional element
(e) depositing metal into the pattern of features to fabricate a feature layer comprising a first part of the at least one constructional element;
(f) stripping away the first layer of photoresist;
(g) applying a second layer of photoresist;
(h) exposing and developing a pattern of via posts comprising a second part of the at least one constructional element;
(i) depositing a metal layer comprising the second part of the at least one constructional element into the negative pattern;
(j) stripping away the photoresist leaving the at least one non-electronically functional elongated metallic inclusion upstanding;
(k) removing the seed layer to isolate the at least one constructional element, and
(l) laminating a dielectric material over the at least one non-electronically functional elongated metallic inclusion.

In some embodiments, the method comprises the further step:
(m) thinning the multilayer electronic support structure to expose ends of via posts.

In some embodiments, the method comprises the further step:
(n) depositing a metal seed layer over the thinned surface.

In some embodiments, the at least one constructional element comprises a further feature layer and steps (c) to (f) and (l) are repeated.

In some embodiments, the at least one constructional element comprises a further via post layer that is fabricated by repeating steps (g) to (k).

In some embodiments, the at least one via post layer includes a part of at least one constructional element and the process comprises the steps of: (i) obtaining a substrate including an underlying feature layer where the copper thereof is exposed;
(ii) covering the substrate with a seed layer;
(iii) depositing a metal layer over the seed layer;
(iv) applying a layer of photoresist over the metal layer;
(v) exposing and developing a positive pattern of via posts including the at least one constructional element;
(vi) etching away the metal layer exposed;
(vii) stripping away the photoresist, leaving via posts including the at least one constructional element upstanding, and
(viii) laminating a dielectric material over the via posts and at least one constructional element.

In some embodiments, the process comprises the further step:
(ix) thinning to expose the metal.

In some embodiments, the process comprises the further step:

(x) depositing a metal seed layer over the thinned surface.

BRIEF DESCRIPTION OF FIGURES

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice.

In the accompanying drawings.

DESCRIPTION OF EMBODIMENTS

Figure 1:
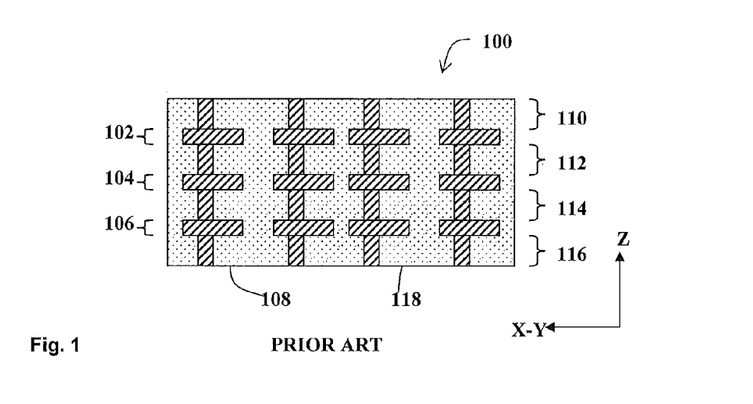
FIG. 1 is a section through a multilayer electronic support structure of the prior art.

With reference to FIG. 1, a simplified section through a multilayer electronic support structure of the prior art is shown. With reference to FIG. 1, multilayer support structures 100 of the prior art include functional layers 102, 104, 106 of components or features 108 separated by layers of dielectric 110, 112, 114, 116, which insulate the individual layers. Vias 118 through the dielectric layer provide electrical connection between the adjacent functional or feature layers. Thus the feature layers 102, 104, 106 include features 108 generally laid out within the layer, in the X-Y plane, and vias 118 that conduct current across the dielectric layers 110, 112, 114, 116. Vias 118 are designed to have minimal inductance and are sufficiently separated to have minimum capacitances therebetween.

Where vias are fabricated with drill & fill technology, the vias generally have a substantially circular cross-section. However, as described in U.S. Pat. Nos. 7,682,972, 7,669,320 and 7,635,641 for example, the structure of FIG. 1 may alternatively be fabricated by electroplating into a pattern in a photo-resist (pattern plating), or by panel plating and then selectively etching; either way leaving up-standing via posts, and then laminating a dielectric pre-preg thereover.

Using the 'drilled and filled via' approach, it becomes prohibitive to fabricate non-circular vias due to difficulties in cross-section control and shape. There is also a minimum via size of about 50-60 micron diameter due to the limitations of the laser drilling. These difficulties are related, inter-alia, to dimpling and/or domed shaping that result from the copper via fill electro-plating process, via tapering shape and side wall roughness that result from the laser drilling process and higher cost that results from using the expensive laser drilling machine for milling slots, in a 'routing' mode to generate trenches in the polymer/glass dielectrics.

It has been surprisingly found that using the flexibility of the plating and photo-resist techniques, a wide range of via shapes and sizes may be cost-effectively fabricated. Furthermore, different via shapes and sizes may be fabricated in the same layer. The proprietary via post approach developed by AMITEC, enables structures that extend in the x-y plane to be fabricated within a via layer, typically among more traditional via posts. This is especially facilitated when the copper pattern plating approach is used, where smooth, straight, non-tapering trenches may be produced in a photo-resist material, and then filled by subsequently depositing copper into these trenches by pattern plating copper into the trenches onto a seed layer. In contrast to the drilled & filled via approach, via post technology enables trenches in a photoresist layer to be filled to obtain dimple-less, dome-less copper structures. After deposition of the copper the photo-resist is subsequent stripped away, the metal seed layer is subsequently removed and a permanent, polymer-glass dielectric is applied thereover and therearound. The copper structure thus created may use the process flows as described in U.S. Pat. Nos. 7,682,972, 7,669,320 and 7,635,641 to Hurwitz et al.

It will be appreciated that interconnects are required to be sufficiently stiff and rigid so that chips can connect reliably to them. Warping and bending may create poor or broken connections.

One way of ensuring rigidity is to deposit the interconnect structure onto a substrate or core. Unfortunately this increases the thickness of the interconnect structure.

There is a drive for ever thinner interconnects that are also rigid and stiff.

Amongst various chip mounting technologies are the so called, Flip Chip technologies such as Flip Chip Ball Grid Array (FCBGA), Flip Chip Chip Scale Package (FCCSP), Flip Chip Pin Grid Array (FCPGA) and Flip Chip Land Grid Array (FCLGA).

Generally, the substrate or interposer for Flip Chip technologies is no more than 1.2× of than the size of the chip. Flip Chip Ball Grid Array mounting and FCBGA and Flip Chip Chip Scale Package (FCCSP) are particularly sensitive to warpage during assembly.

It has surprisingly been found possible to fabricate an interconnect structure that is both thin and stiff, by electroplating stiffeners thereinto. Such stiffeners are constructional elements that span one or more via planes, extend in the X-Y direction but do not serve an electronic function.

The Flip Chip is generally between 5 mm×5 mm and 25 mm×25 mm in size.

FCBGA substrate sizes are usually ranging from 10 mm×10 mm to 60 mm×60 mm and may be square or rectangular. FCCSP substrate sizes are usually ranging from 10 mm×10 mm to 25 mm×25 mm To stiffen a substrate or interposer, constructional elements may be arranged in different positions within the multilayer support structure but typically are positioned in the peripheral areas around the central, electrically functional area where the chip is positioned. The constructional elements may have various cross-sections or profiles, as discussed below.

Figure 2A:
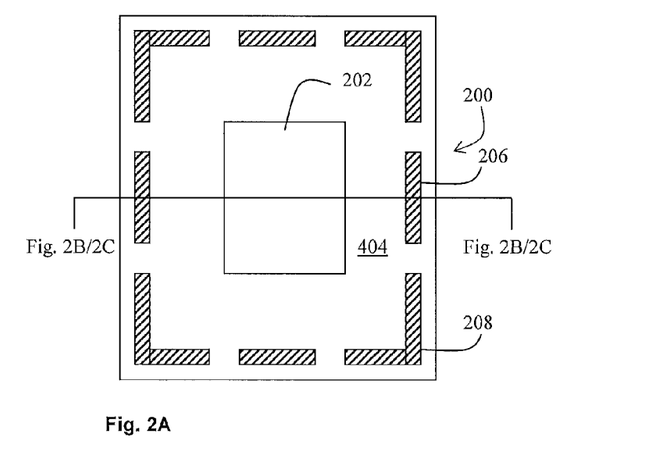
FIG. 2A is a plan view of an embodiment of an electronic support structure including constructional elements.

With reference to FIG. 2A, a plane view of a multilayer electronic support structure 200 is shown. The multilayer electronic support structure 200 typically has planar dimensions of between 10 mm×10 mm and 60 mm×60 mm for FCBGAs and may be square or rectangular.

FCCSP substrate sizes generally range from 10 mm×10 mm to 25×25 mm.

As one moves away from the chip towards the edges of the multilayer electronic support structure, there are areas that are not required for electrical conductivity and may be used for stiffening purposes.

The multilayer electronic support structure 200 serves as an interconnect for an application such as connecting a chip to a printed circuit board, for example. Typically, the multilayer electronic support structure 200 has a central functional area 202 of conductive vias and features, such as shown in FIG. 1, for example, around which, there is generally provided a non-functional surround 404. The central functional area 202 of conductive vias and features may have dimensions of between 10 mm×10 mm and 25 mm×25 mm.

Figure 2B:
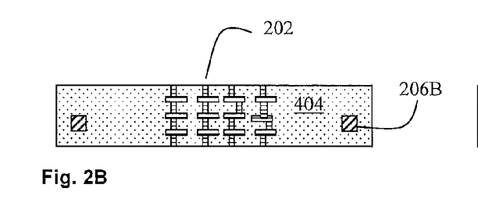
FIG. 2B is a cross-sectional view through FIG. 2A in accordance with one embodiment where the constructional elements are in one via layer.
Figure 2C:
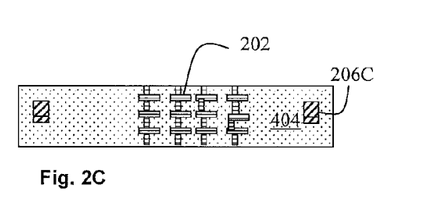
FIG. 2C is a cross-sectional view through FIG. 2A in accordance with another embodiment where the constructional elements comprise sub-components in both via and feature layers.

One or more constructional elements such as one or more constructional edges 206 and one or more constructional corners 208 may be cofabricated with the conductive vias and features of the central functional area 202, and, as shown in FIG. 2B, may span only one layer of via posts. Typically, as discussed below, and shown in FIG. 2C, a constructional element may span both a feature layer and a via layer. They may span further layers.

The constructional edges 206 and constructional corners 208 may help relieve residual stresses and may thereby prevent warping of the substrate 200 and help ensure planarity is maintained.

Figure 3:
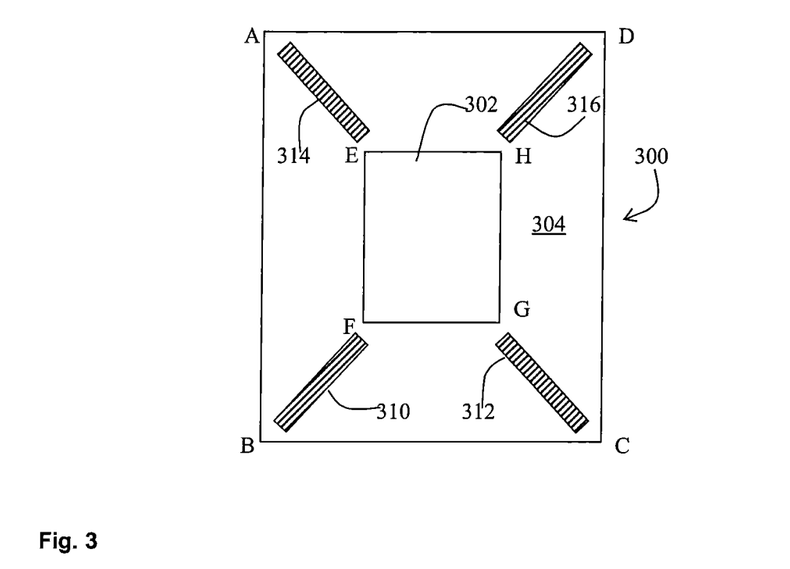
FIG. 3 is a plan view of yet another embodiment of an electronic support structure including constructional elements.

Referring to FIG. 3, in a second embodiment, a multilayer electronic support structure 300 may comprise a plurality of constructional elements 310, 312, 314, 318 arranged radially around the central functional area 302, spanning from the corners of the central functional area 302 across the surrounding structure 304 towards the corners A, B, C, D of the multilayer electronic support structure 300. Thus a diagonal strut 310 may connect corner B of substrate 300 to corner F of central functional area 302. Diagonal strut 312 may connect corner C of substrate 300 to corner G of central functional area 302. Diagonal strut 314 may connect corner A of substrate 300 to corner E of central functional area 302. Diagonal strut 316 may connect corner D of substrate 300 to corner H of central functional area 302.

Figure 4:
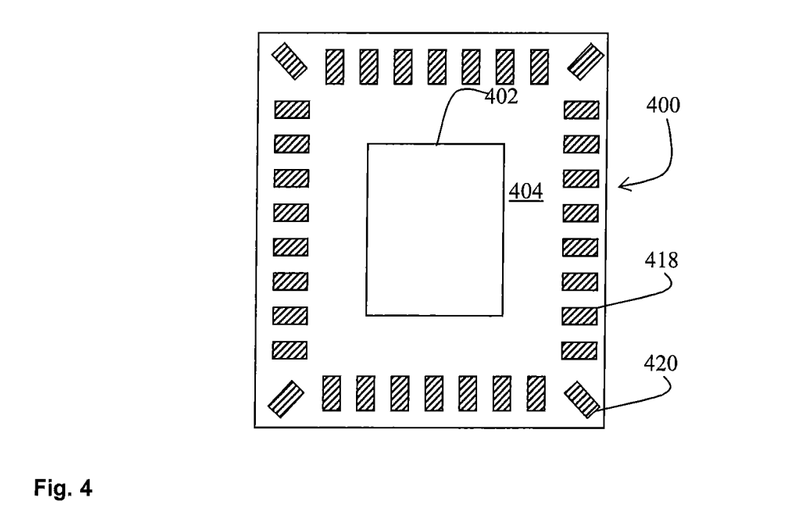
FIG. 4 is a plan view of still yet another embodiment of an electronic support structure including constructional elements.

With reference to FIG. 4, in a third embodiment, a multilayer electronic support structure 400 may comprise a plurality of constructional elements 418, arranged radially around the central functional area 402, mostly perpendicular to the nearest long edge, but in the corners, diagonal constructional elements 420 may be provided.

Figure 5:
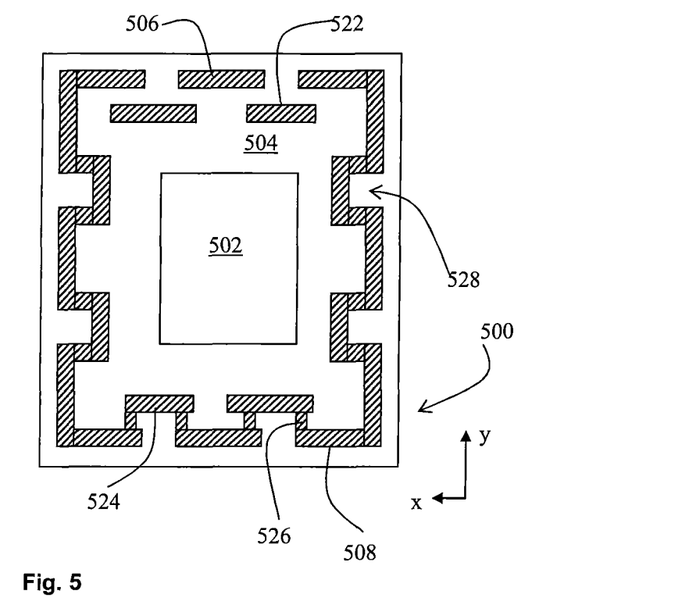
FIG. 5 is a plan view of a further embodiment of an electronic support structure including constructional elements.

Referring to FIG. 5, in a fourth embodiment, a multilayer electronic support structure 500 comprises a plurality of constructional strips 506 along an outer row near the edge of the structure 500 and constructional corners 508 and a second, inner row of constructional strips 522 staggered with respect to the outer row of strips 506. A constructional strip 524 in a second row may be coupled to the strips and corners 508 in the outer row by ties 526. Indeed, as the outer strips 506, corners 508, inner constructional strips 522, 524 and ties 526 may be co-deposited by pattern plating or by panel plating with subsequent etching, there is an almost infinite variety of reinforcing shapes and sizes that may be manufactured. In addition to reinforcing an edge with one or more layers of strips, which may be tied together with tie pieces codeposited or left isolated within the dielectric 504 surround, an edge may be reinforced by a crenellated constructional strip 528, or by a corrugated constructional strip.

Figure 6:
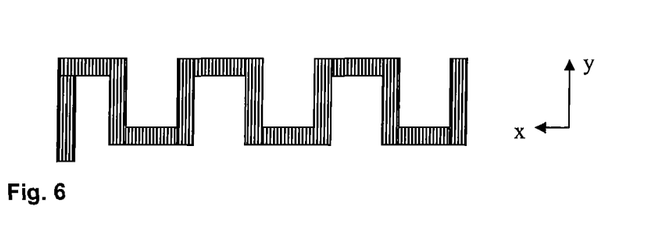
FIG. 6 is schematic illustration of a crenellated constructional element.

As shown in FIG. 6, constructional elements, wherever positioned, may, in addition to being bar like strips, may be elongated crenulated elements 628 or corrugated elements (not shown).

Thus a multilayer electronic support structure may be stiffened to aid planarity and to prevent warping by incorporating at least one constructional element that is typically a non-electronically functional elongated metallic inclusion within the dielectric multilayer electronic support structure.

So far, the shape of the constructional elements within the x-y plane has been discussed. It will be appreciated that constructional elements have a thickness and may span a single via post layer, or may span more than one layer.

As the electronically functional elements found in the central functional area may be codeposited with the constructional elements, in some embodiments, the constructional element which is a non-electronically functional elongated metallic inclusion may be fabricated as a first part or pad in a feature layer, and a second part in a via post layer laid down on top of the first part or pad in the feature layer.

Figure 7:
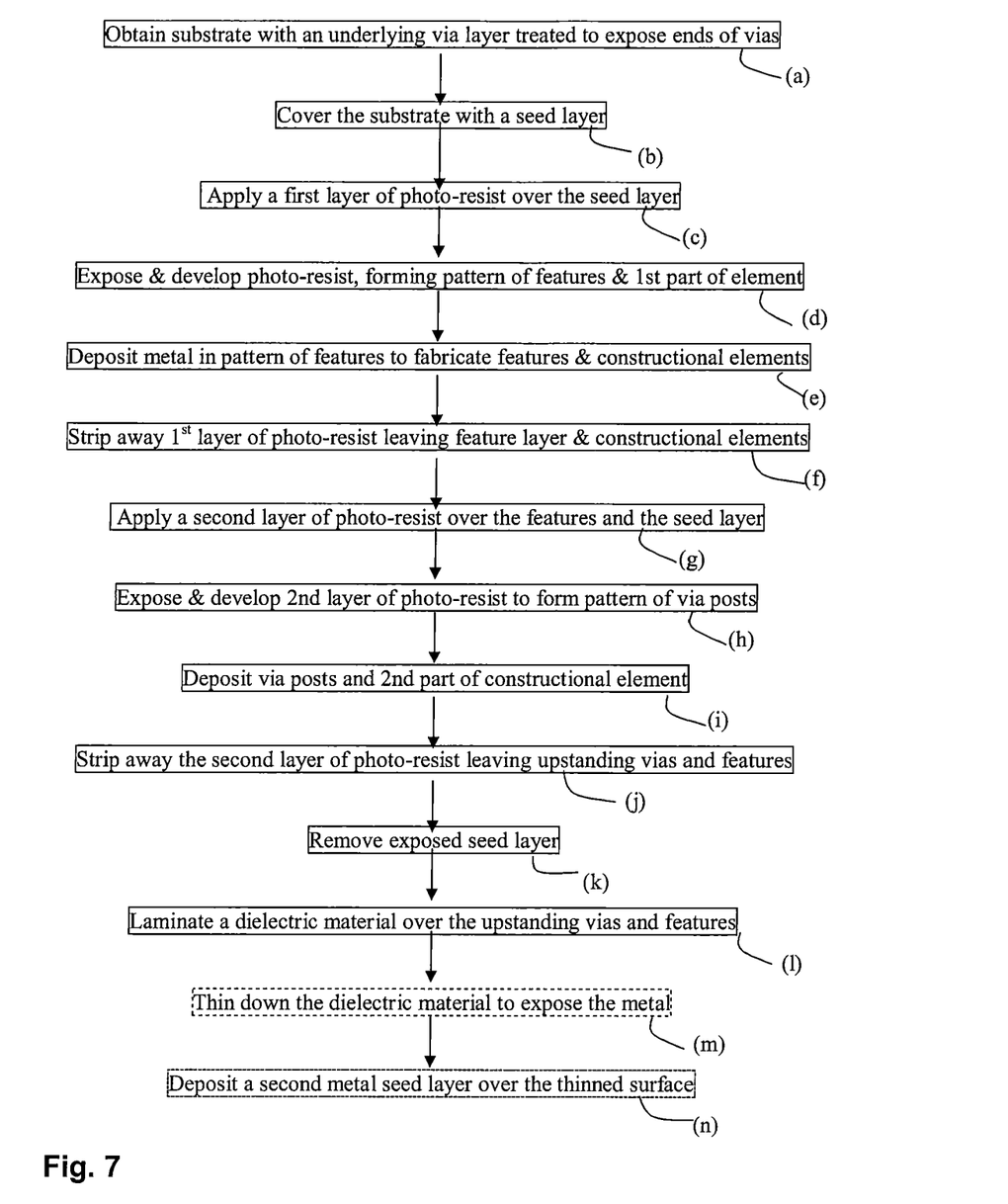
FIG. 7 is a flowchart of one method for fabricating constructional elements.

With reference to FIG. 7, the at least one constructional element may be fabricated from at least one pair of parts consisting of a first part in a feature layer and a second part in a via post layer deposited thereover, in a two stage process consisting of the following steps: obtaining a substrate including an underlying via post layer that has been treated to expose the ends of the via posts—step (a). Typically the treatment to expose the ends of the via posts includes chemical polishing, mechanical grinding and polishing, or chemical-mechanical polishing CMP. The substrate with the exposed ends of the copper vias is now coated with a seed layer, typically copper—step (b). A first, thin layer of photoresist is applied over the seed layer—step (c), and the first, thin layer of photoresist is exposed and developed to form a negative pattern of features that includes a first part of the at least one constructional element—step (d). A metal, typically copper, is deposited into the negative pattern of features and, inter alia, forms the first part of the at least one constructional element—step (e). The first thin layer of photoresist is stripped away—step (f) leaving the layer of features including the first part of the at least one constructional element upstanding. A second, thicker layer of photoresist is now applied—step (g) and a second negative pattern of via posts including a second part of the at least one constructional element is exposed and developed therein—step (h). A layer of metal, typically copper, is deposited in the trenches developed in the second pattern—step (i) to fabricate a layer of via posts including the second part of the at least one constructional element over at least part of the first part of the at least one constructional element. The second layer of photoresist is stripped away—step (j) leaving the features, via posts and the at least one constructional element upstanding. The exposed seed layer is now removed—step (k) to isolate the at least one constructional element. The removal of the exposed seed layer may be accomplished by exposing the structure to a short and controlled wet etch of ammonium hydroxide or copper chloride, for example. A dielectric material is then laminated over the features the via posts and the at least one constructional element—step (l).

Where the via post has the same dimensions in the X-Y plane as the underlying feature layer or pad, the non-electronically functional elongated metallic inclusion may have the profile of a simple rectangular stiffener. Where the underlying feature layer or pad extends beyond the via post, the non-electronically functional elongated metallic inclusion may have the profile of an L beam or a J beam. If a second seed layer is deposited thereover, and a second feature layer is laid down on top, the non-electronically functional elongated metallic inclusion may have a T or I shaped profile.

In this manner, constructional elements comprising a first part in a feature layer and a second part in a via layer may be fabricated. The first part in the feature layer may be fully covered with the second part in the via layer creating a constructional element with a square or rectangular cross-section. If the first part in the feature layer extends further in the X-Y plane than the second part in the via layer, the constructional element will have a cross-section resembling an L or J beam or inverted T. If used upside down, the inverted T cross-section will, of course, resemble a T. Linear constructional element of constant width, that extend in the X-Y plane, and have square, rectangular, J, L or T cross-sections will behave as square, rectangular, J, L or T beams, and resist deformation in accordance with simple beam theory.

By depositing a further seed layer and an additional part in a feature layer, a square or rectangular constructional element may be converted into a T constructional element, and an inverted T constructional element may be converted into an I constructional element.

By depositing further via and feature layers, constructional elements with more complicated cross-sections that span more layers of the multilayer electronic support structure may be fabricated. Thus to enable further build up of additional layers, the dielectric material may be thinned to expose the metal—step (m). The thinning may be accomplished using mechanical grinding or polishing, chemical polishing, or chemical mechanical polishing CMP. The thinning also planarizes the structure. Then a metal seed layer, such as copper, may be deposited over the thinned surface—step (n), to enable further layers to be built up. The seed layer is typically 0.5 microns-to 1.5 microns. To aid its adhesion, an adhesive layer of titanium, tantalum, chromium, tungsten or mixtures thereof, typically being 0.04 to 0.1 microns thick, may be first deposited. The seed layer may be deposited using sputtering or electroless plating, for example.

Where the constructional element comprises a further feature layer it may be fabricated by repeating steps (c) to (f) and (l). Where the constructional element comprises a further via post layer this may be fabricated by repeating steps (g) to (k), and so on.

The dielectric material is generally a composite material comprising a polymer matrix, such as polyimide, epoxy, Bismaleimide, Triazine and blends thereof, and may further comprise ceramic or glass. Typically the dielectric is provided as a prepreg consisting of woven glass fiber bundles in a polymer resin pre-preg with ceramic fillers.

Figure 8:
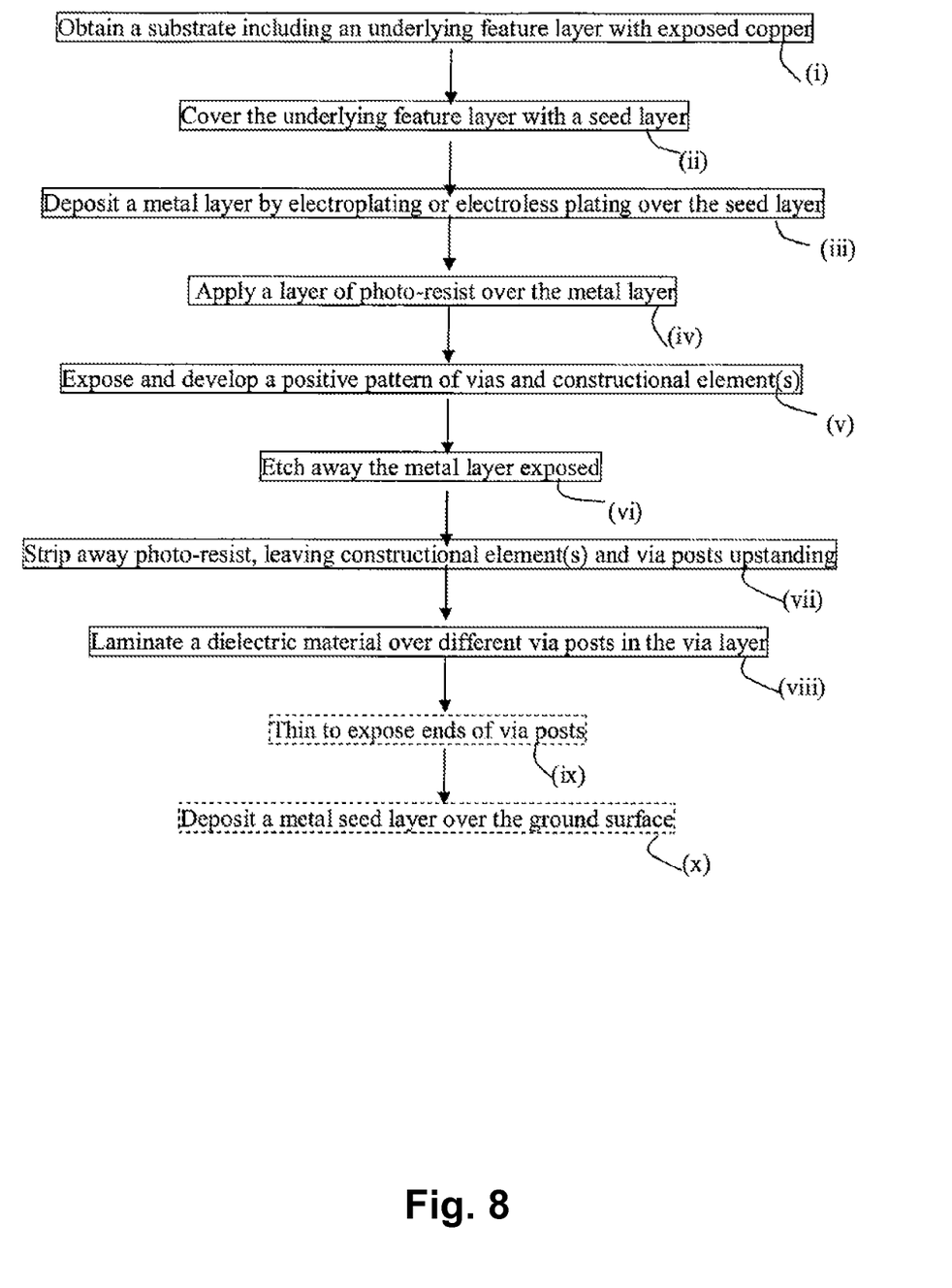
FIG. 8 is a flowchart of a variant method for fabricating constructional elements.

Referring to FIG. 8, in a variant fabrication route, a via post layer including a part of a constructional element may be fabricated by the steps of: obtaining a substrate—step (i), and covering the substrate with a seed layer—step (ii) which is typically copper and is typically deposited by sputtering or by electroless plating. A metal layer is deposited over the seed layer—step (iii). This metal layer is typically copper, and may be deposited by electroplating. A layer of photoresist is laid down over the metal layer—step (iv), and a positive pattern of via posts including the part of the constructional element is exposed and developed therein—step (v). The metal layer exposed is etched away—step (vi). The etching away of copper may be performed using a copper etchant, such as ammonium hydroxide or copper chloride, for example. The photoresist is then stripped away—step (vii), leaving the constructional element in the via layer upstanding, and a dielectric material is laminated over the via layer and at least one constructional element—step (viii).

To enable further build up, the dielectric layer may be thinned—step (ix) to expose the metal, using chemical or mechanical polishing or grinding, or chemical mechanical polishing, for example. The thinning planarizes the layer.

Then a metal seed layer, such as copper, may be deposited—step (x) over the thinned surface.

In some embodiments, the method further comprises building up additional parts of the at least one constructional element, layer by layer, by plating further layers thereover.

Figure 9:
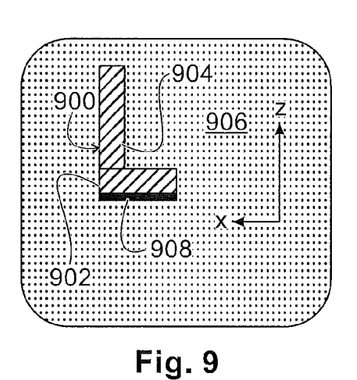
FIG. 9 is a schematic illustration of a section through an L shaped support element surrounded by a dielectric material.
Figure 9A:
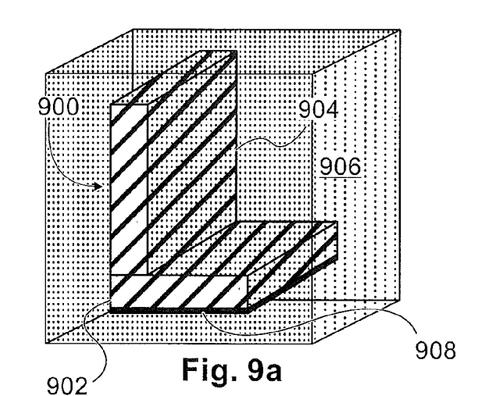
FIG. 9a is an isometric projection of a linear L shaped support.

With reference to FIG. 9, a constructional element with an L shaped profile (cross section) 900 is shown. The L shaped constructional element 900 consists of wide first part 902 (in a feature layer) and a narrow second part 904 (in a via layer) that may be may be deposited onto the wider first part 902. The first part 902 will generally by deposited over an underlying seed layer 908. The L shaped constructional element 900 is surrounded by and insulated with a dielectric material 906 which is typically a glass fiber reinforced polymer applied as a pre-preg. A J shaped constructional element may be fabricated in the same way.

Figure 10:
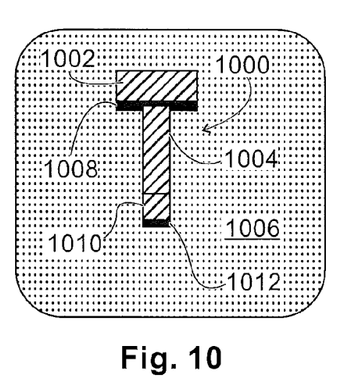
FIG. 10 is a schematic illustration of a section through a T shaped support element surrounded by a dielectric material.
Figure 10A:
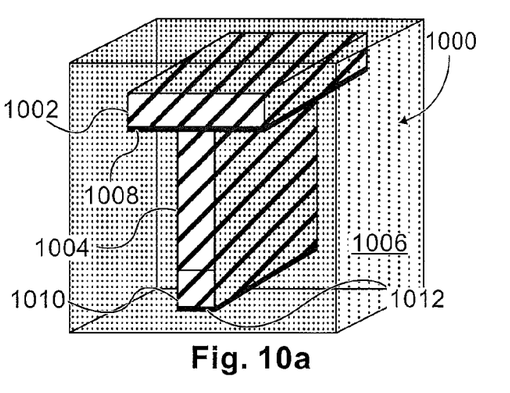
FIG. 10a is an isometric projection of a linear T shaped support element.

Referring to FIG. 10, a T shaped constructional element 1000 is shown. Since the second layer 1002 extends beyond the first layer 1004, over the dielectric surround 1006, a seed layer 1008 and perhaps an adhesive layer thereunder, are deposited by sputtering or electroless plating before depositing the further layer 1002. The seed layer 1008 facilitates electroplating the further layer 1002 onto the dielectric material 1006. The first layer 1004, will, of course, also generally be deposited over an underlying pad 1010 which itself, is fabricated over a seed-layer 1012.

Figure 11:
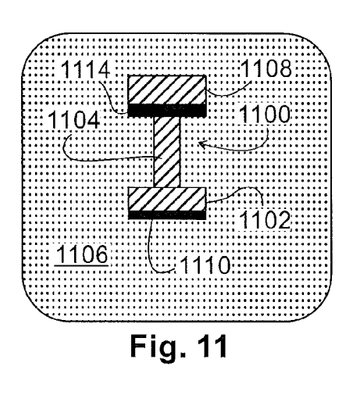
FIG. 11 is a schematic illustration of a section through an I shaped support element surrounded by a dielectric material.
Figure 11A:
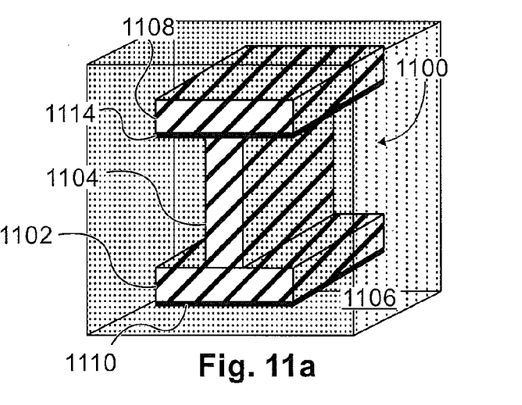
FIG. 11a is an isometric projection of a linear I shaped support element.

Referring to FIG. 11, an I shaped constructional element 1100 may be fabricated by patterning three layers of metal 1102, 1104, 1108, and laminating dielectric 1106 therearound in two or three stages. The first 1102 and third 1108 layers of the I shaped constructional element 1000 will typically be feature layers deposited over seed layers 1110, 1114 to enable adhesion to the dielectric material 1106. The second layer 1104, which is the vertical part of the I shaped constructional element 1000, is typically fabricated in a via post layer, and since it is deposited onto a wider first (feature) layer 1002 thereunder, it does not require a seed layer thereunder.

The constructional elements shown in FIGS. 9, 10 and 11 are provided by way of example only. Other constructional elements may have different shapes and may span more than three layers of a multilayer interconnect structure.

The various constructional structures and arrangements shown are provided by way of example, and different embodiments may include further constructional metal inclusions and may be arranged differently.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

The invention claimed is:

1. A multilayer electronic support structure, comprising:
    at least one pair of adjacent circuit layers comprising circuit elements extending in an X-Y plane that are embedded in dielectric material and that are separated by a via layer;
    said adjacent circuit layers and said via layer comprising metallic vias that are embedded in said dielectric material comprising glass fibers in a polymer matrix, said adjacent circuit layers comprising metallic features and said via layer that is sandwiched between the two adjacent circuit layers comprising metallic vias that electrically couple said adjacent circuit layers; and
    at least one non-electronically functional metallic constructional element disposed within the dielectric material and spanning at least the via layer in a Z direction perpendicular to the X-Y plane;
    wherein said at least one non-electronically functional metallic constructional element comprises a metallic via post having a long dimension in the X-Y plane that is at least 3 times as long as a short dimension in the X-Y plane; and
    wherein the at least one non-electronically functional metallic constructional element is fully encapsulated within the dielectric material and is electrically isolated from its surrounding.

2. The multilayer electronic support structure of claim 1 comprising a central electronically functional area of said metallic vias and said circuit layers and a surrounding area, wherein the non-electronically functional metallic constructional element is situated in the surrounding area.

3. The multilayer electronic support structure of claim 2 wherein the central electronically functional area of said metallic vias and said circuit layers is for coupling a chip by a Flip Chip technology.

4. The multilayer electronic support structure of claim 3, wherein said Flip Chip technology is selected from the group consisting of Flip Chip BGA (FCBGA), Flip Chip Chip Scale Package (FCCSP), Flip Chip Pin Grid Array (FCPGA) and Flip Chip Land Grid Array (FCLGA).

5. The multilayer electronic support structure of claim 2 having planar dimensions of at least 10 mm×10 mm and no more than 60 mm×60 mm.

6. The multilayer electronic support structure of claim 2, wherein the central electronically functional area has dimensions of at least 5 mm×5 mm and no more than 25 mm×25 mm.

7. The multilayer electronic support structure of claim 2, wherein said at least one non-electronically functional metallic constructional element is positioned in the surrounding area along all sides of the central electronically functional area.

8. The multilayer electronic support structure of claim 1, wherein the at least one non-electronically functional metallic constructional element is for relieving residual stresses and aiding planarity.

9. The multilayer electronic support structure of claim 1, wherein the at least one non-electronically functional metallic constructional element is positioned along an edge of the support structure.

10. The multilayer electronic support structure of claim 1, for supporting a chip, comprising a plurality of non-electronically functional metallic constructional elements arranged radially around the chip.

11. The multilayer electronic support structure of claim 1, wherein the at least one non-electronically functional metallic constructional element comprises a corner angle for positioning in a corner of the support structure.

12. The multilayer electronic support structure of claim 1, wherein the at least one non-electronically functional metallic constructional element is embedded within a single via layer.

13. The multilayer electronic support structure of claim 1, wherein the at least one metallic constructional element spans a plurality of layers.

14. The multilayer electronic support structure of claim 1, wherein the at least one non-electronically functional metallic constructional element has a profile that is selected from the group consisting of square shaped profiles, rectangular shaped profiles, T shaped profiles, inverted T shaped profiles, I shaped profiles, J shaped profiles and L shaped profiles.

15. The multilayer electronic support structure of claim 14, wherein the at least one non-electronically functional metallic constructional element comprises a first sub-component in a circuit layer and a second sub-component in a via layer with said second sub-component having a non-circular cross-section.

16. The multilayer electronic support structure of claim 15 wherein the first sub-component comprises an adhesive layer comprising a metal selected from the group comprising titanium, tantalum, tungsten and chromium.

17. The multilayer electronic support structure of claim 1 wherein the non-electronically functional constructional element is corrugated or crenulated along its length.

18. The multilayer electronic support structure of claim 1, wherein the polymer comprises polyimide, epoxy, Bismaleimide, Triazine and blends thereof.

19. The multilayer electronic support structure of claim 18, wherein the dielectric material further comprises inorganic inclusions.

20. The multilayer electronic support structure of claim 19 wherein the inorganic inclusions comprises ceramic particles.

* * * * *